United States Patent
Iwasaki et al.

(10) Patent No.: US 7,253,363 B2
(45) Date of Patent: *Aug. 7, 2007

(54) CIRCUIT BOARD

(75) Inventors: Shota Iwasaki, Tokyo (JP); Takehito Inaba, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/964,284

(22) Filed: Oct. 12, 2004

(65) Prior Publication Data

US 2005/0045371 A1    Mar. 3, 2005

Related U.S. Application Data

(62) Division of application No. 09/768,633, filed on Jan. 24, 2001, now Pat. No. 6,815,619.

(30) Foreign Application Priority Data

Jan. 25, 2000    (JP)    ............... 2000-16168

(51) Int. Cl.
*H05K 1/03*    (2006.01)

(52) U.S. Cl. ............... 174/255; 174/254; 174/262

(58) Field of Classification Search ............ 174/255, 174/262, 260, 266, 263, 264, 265, 254; 361/760, 361/792, 793, 794, 795, 748

See application file for complete search history.

(56) References Cited

U.S. PATENT DOCUMENTS

| | | |
|---|---|---|
| 4,249,302 A | 2/1981 | Crepeau et al. |
| 5,039,965 A | 8/1991 | Higgins, Jr. |
| 5,376,759 A | 12/1994 | Marx et al. |
| 5,378,859 A | 1/1995 | Shirasaki et al. |
| 5,677,575 A | 10/1997 | Maeta et al. |
| 5,962,917 A * | 10/1999 | Moriyama ............... 257/697 |
| 5,966,294 A | 10/1999 | Harada et al. |
| 6,049,122 A | 4/2000 | Yoneda |
| 6,191,367 B1 * | 2/2001 | Hayashi ............... 174/260 |
| 6,198,165 B1 | 3/2001 | Yamaji et al. |
| 6,232,560 B1 * | 5/2001 | Lin ............... 174/257 |
| 6,281,450 B1 | 8/2001 | Urasaki et al. |

(Continued)

FOREIGN PATENT DOCUMENTS

JP    58-105166    7/1983

(Continued)

*Primary Examiner*—Ishwar (I. B.) Patel
(74) *Attorney, Agent, or Firm*—Katten Muchin Rosenman LLP

(57) ABSTRACT

A circuit board including a base member, an interconnect layer formed on a part of the base member, an electrically-floating conductive layer formed on a substantially remaining part of the base member and having an edge adjacent to an edge of the interconnect layer, and a dielectric layer covering a part of the interconnect layer and an entire surface of the electrically-floating conductive layer and filling a gap between the edge of the interconnect layer and the edge of the electrically-floating conductive layer. In accordance with the present invention, almost all the surface of the base member is covered with the interconnect layer and the floating conductive layer disposed parallel to each other on a substantially single plane. In the circuit board, the moisture does not enter into the rear surface of the dielectric layer through the externally exposed portion to improve the packaging rank.

9 Claims, 5 Drawing Sheets

U.S. PATENT DOCUMENTS 6,411,519 B2    6/2002    Asai et al.
6,507,100 B1 *  1/2003    Valluri et al. ............... 257/697

FOREIGN PATENT DOCUMENTS

| JP | 61-24295   | 2/1986  |
|----|------------|---------|
| JP | 61-34765   | 3/1986  |
| JP | 62-178564  | 11/1987 |
| JP | 64-051697  | 2/1989  |
| JP | 1-316989   | 12/1989 |
| JP | 403045398  | 2/1991  |
| JP | 04-188886  | 7/1992  |
| JP | 404188886  | 7/1992  |
| JP | 04261098   | 9/1992  |
| JP | 405299785  | 11/1993 |
| JP | 06-69212   | 3/1994  |
| JP | 07-154039  | 6/1995  |
| JP | 07-273243  | 10/1995 |
| JP | 07-278415  | 10/1995 |
| JP | 07263871   | 10/1995 |
| JP | 08-279680  | 10/1996 |
| JP | 409181445  | 7/1997  |
| JP | 10-013003  | 1/1998  |
| JP | 410233578  | 9/1998  |
| JP | 10-275961  | 10/1998 |
| JP | 10-341077  | 12/1998 |
| JP | 11-040698  | 2/1999  |
| JP | WO99/21224 | * 4/1999 |
| JP | 11-154679  | 6/1999  |
| JP | 11-260962  | 9/1999  |
| JP | 11-354676  | 12/1999 |

* cited by examiner

CIRCUIT BOARD

CROSS-REFERENCE TO RELATED APPLICATION

This application is a Divisional Application of application Ser. No. 09/768,633, filed on Jan. 24, 2001, U.S. Pat. No. 6,815,619.

BACKGROUND OF THE INVENTION (a) Field of the Invention

The present invention relates to a circuit board preferably used in a semiconductor device such as having a land grid array (LGA) and a ball grid array (BGA).

(b) Description of the Related Art

Recently, a multi-layered circuit board of higher integration is required for fabricating a semiconductor device package with smaller dimensions.

The circuit board for meeting the above requirement generally includes a base member mounting thereon a plurality of interconnect layers which sandwich dielectric layers therebetween. The base member includes a first and a second interconnect layers on the respective surfaces thereof, and the interconnect layers are connected with each other through a via-hole formed in the base member.

In such a circuit board, a relatively large part of the dielectric layer is externally exposed. When the circuit board is exposed to a higher humidity atmosphere, moisture enters into the rear surface of the dielectric layer through the externally exposed portion.

When the first and the second interconnect layers are formed by conductive materials having different coefficients of thermal expansion, a crack may be generated in the circuit board by the warp in case of a rapid temperature change.

The above problem incurs lower reliability of such as having a lower packaging rank and failing in the temperature cycle test. In order to suppress the above problem, it is proposed that the interconnect layers and the dielectric layers be formed by materials having substantially same coefficients of thermal expansion or the thicknesses of the respective interconnect layers be increased.

However, the selection of the specific materials at the time of fabricating the circuit boars is burdensome and raises the cost. Further, the increased thickness makes the entire circuit board larger not to meet the recent demand of the miniaturization.

JP-A-6(1994)-69212 describes a circuit board including a dummy conductive film covering an interconnect conductive film with an intervention of a dielectric film. JP-A-7(1995)-154039 describes a circuit board including a dummy conductive pattern formed in a dielectric region having a specific area larger than a circle having a radius of 1 mm. JP-A-10(1998)-341077 describe a circuit board including a dummy conductive layer covering an opening of a via-hole with an intervention of a dielectric film. Although each of the above publications describes suppression (prevention) of the crack generation, none of them describes a method for overcoming the ingress of the moisture into the rear surface of the dielectric layer.

JP-A-11(1999)-154679 describes a circuit board including a dummy via-hole in the vicinity of a via-hole. JP-A-11(1999)-260962 describes a circuit board including a dummy interconnect projected from a conductive interconnect. Although each of these publications describes the prevention of the film peeling-off at the bottom surface of the via hole by dispersing a stress, and the suppression of the increase of the thermal distortion by elevating the rigidity of the dielectric film, none of them describes a method for overcoming the ingress of the moisture into the rear surface of the dielectric layer, similarly to the above publications.

SUMMARY OF THE INVENTION

In view of the foregoing, an object of the present invention is to provide a circuit board meeting the recent demand of the miniaturization and the reduction of cost in addition to satisfying the higher packaging rank and the temperature cycle test.

Thus, the present invention provides a circuit board including a base member, an interconnect layer formed on a part of the base member, an electrically-floating conductive layer formed on a substantially remaining part of the base member and having an edge adjacent to an edge of the interconnect layer, and a dielectric layer covering a part of the interconnect layer and an entire surface of the electrically-floating conductive layer and filling a gap between the edge of the interconnect layer and the edge of the electrically-floating conductive layer.

In accordance with the present invention, almost all the surface of the base member is covered with the interconnect layer and the floating conductive layer disposed parallel to each other on a substantially single plane.

Accordingly, the moisture does not enter into the rear surface of the dielectric layer through the externally exposed portion because of the existence of the floating conductive layer, thereby providing the circuit board having a higher packaging rank and fabricated with lower cost.

Further, because of the existence of the floating conductive layer, the thickness of the interconnect layer can be reduced to provide the circuit board having the reduced thickness, thereby meeting the demand of the miniaturization.

The above and other objects, features and advantages of the present invention will be more apparent from the following description.

PREFERRED EMBODIMENTS OF THE INVENTION

Figure 1:
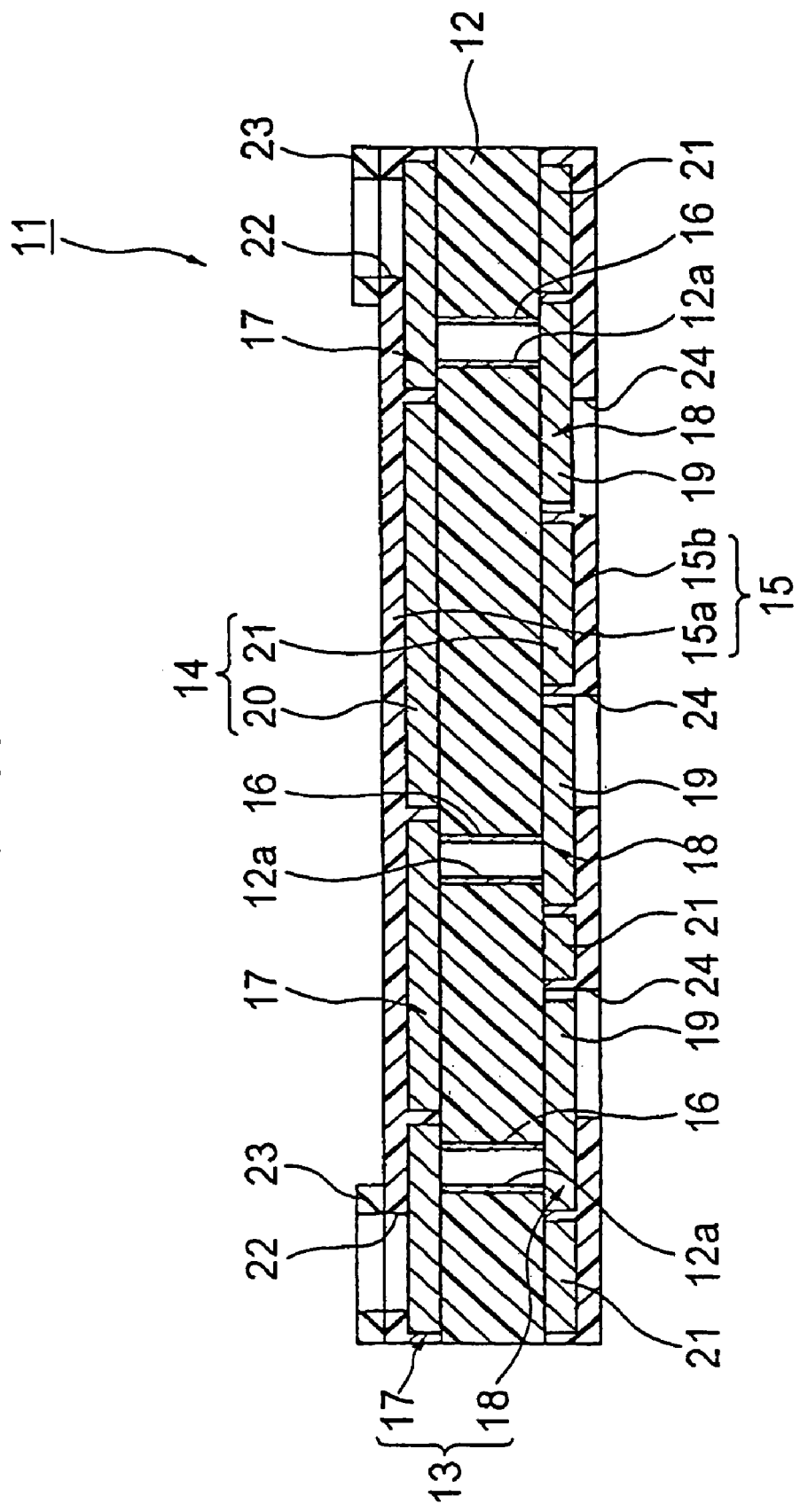
FIG. 1 is a vertical sectional view showing a circuit board in accordance with a first embodiment of the present invention.
Figure 2:
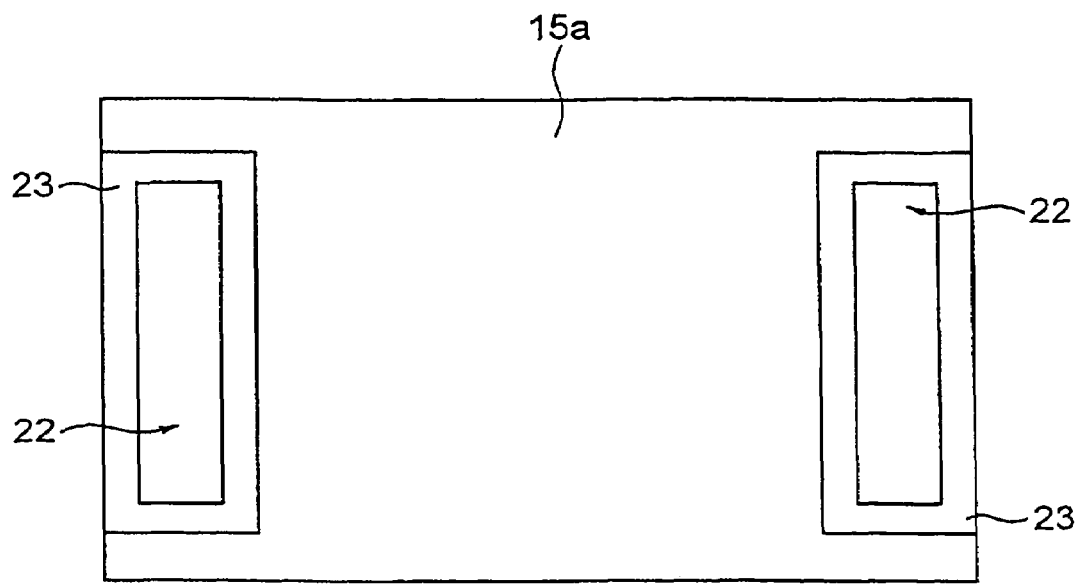
FIG. 2 is a top plan view showing the circuit board of FIG. 1.
Figure 3:
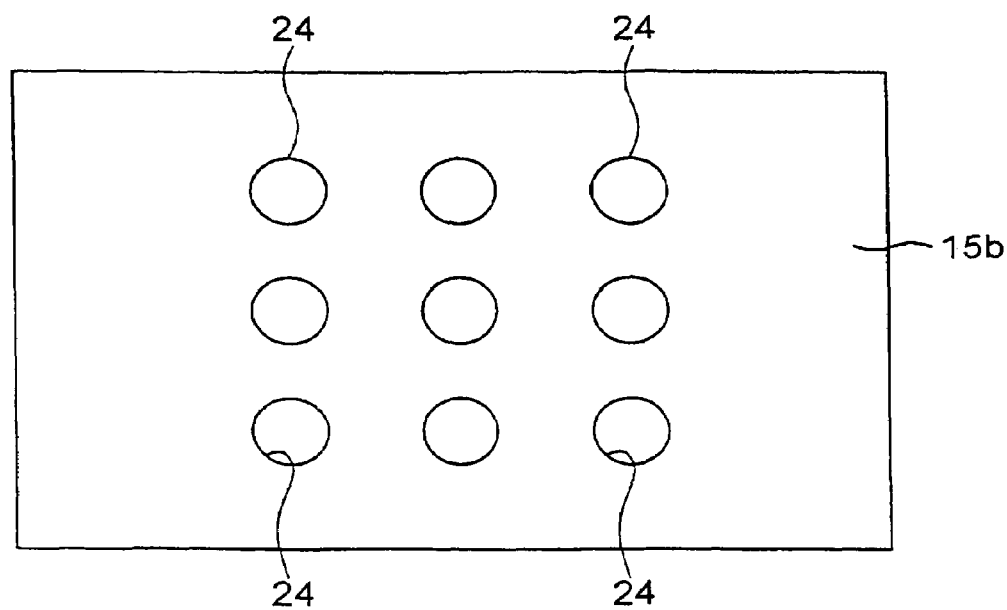
FIG. 3 is a bottom view showing the circuit board of FIG. 1.

Now, the present invention is more specifically described with reference to accompanying drawings.

As shown in FIGS. 1 to 5, a circuit board (double layered interconnect structure) 11 in accordance with a first embodiment includes an interconnect layer 13, a floating conductive layer (electrically-floating conductive layer) 14 and a dielectric layer 15 stacked on both surfaces of a base (core) element 12.

The base member 12 is formed by a dielectric plate made of, for example, eposy resin having a plurality of penetrating holes 12a. The inner surfaces of the penetrating holes 12a are plated with a substance such as a metal using a catalyst for forming via-holes 16.

The interconnect layer 13 includes a top interconnect layer 17 and a bottom interconnect layer 18 formed on the both surfaces of the base member 12, and parts of the interconnect layers 17, 18 are externally exposed. The surface of the interconnect layer 13 is chemically treated (surface-roughing) for elevating the bonding between the interconnect layer 13 and resin or solder resist.

Figure 4:
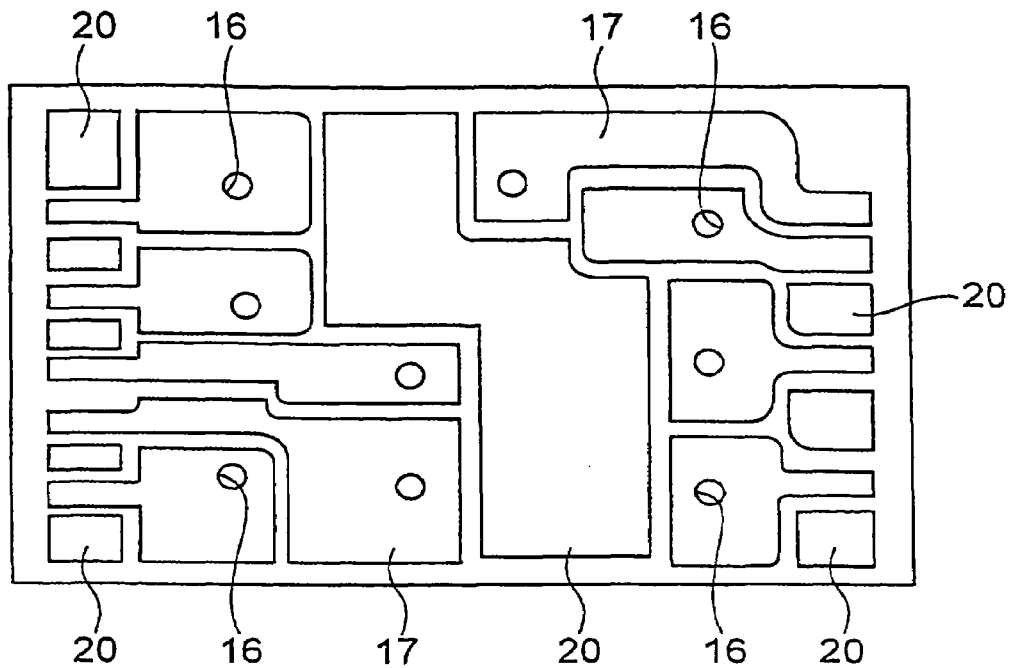
FIG. 4 is a top plan view showing the circuit board of FIG. 1 after an interconnect layer and a floating conductive layer are formed.
Figure 5:
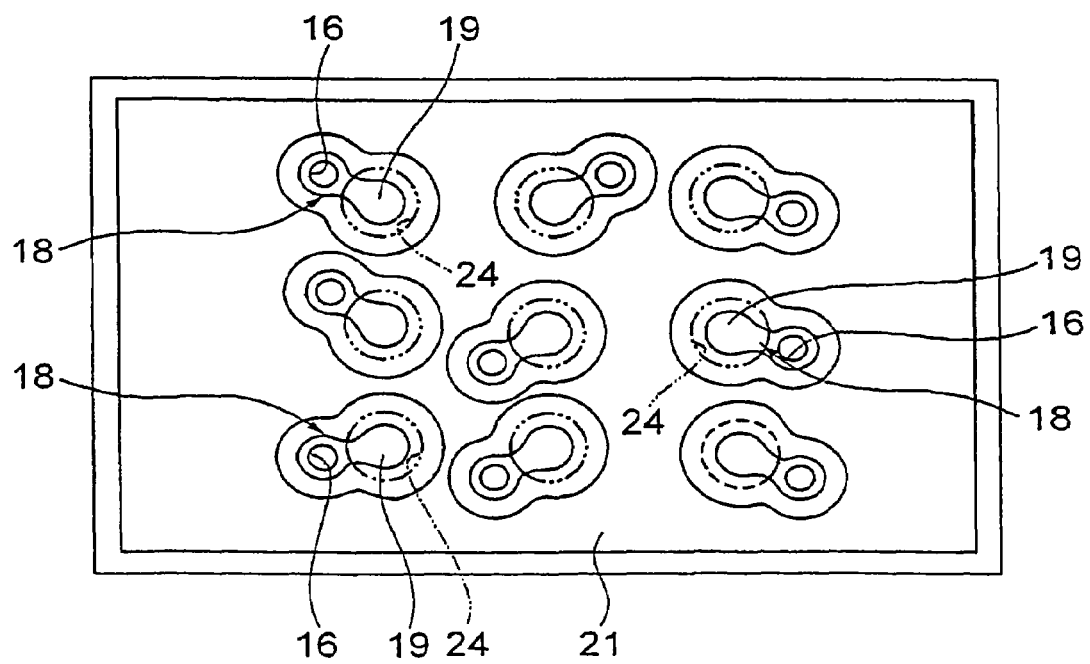
FIG. 5 is a bottom view showing the circuit board of FIG. 4.

The top interconnect layer 17 is connected to an IC pad (not shown) through a bonding wire (not shown), and is formed by using interconnect patterns having a larger width as shown in FIG. 4. Accordingly, a relatively larger surface area of the top surface of the base member 12 is covered with the top interconnect layer 17.

The bottom interconnect layer 18 includes a land 19 which may be soldered to a system circuit board (not shown) and is connected to the via holes 16. The volume of the bottom interconnect layer 18 is adjusted to be the same as that of the top interconnect layer 17, thereby suppressing the generation of a stress due to the warp of the base member 12.

When the surface areas of the both interconnect layers 17, 18 including the floating conductive layers are different from each other, the thickness of the layers are adjusted such that the volumes of the both layers become identical.

When, for example, the layer areas of the top interconnect layer 17 and the bottom interconnect layer 18 are assumed to be 1 cm$^2$ and 0.8 cm$^2$, respectively, the thicknesses of the top interconnect layer 17 and the bottom interconnect layer 18 ($t_1$ and $t_2$) are determined such that an equation "$1 \times t_1 = 0.8 \times t_2$" is satisfied. Thereby, the warp of the circuit board (base member) 11 generated in the package fabrication step and influencing the conveyance can be suppressed and the warp stress generated in the interconnect layer 17 having the larger surface area can be reduced. Accordingly, the circuit board 11 can be fabricated having the higher packaging rank and the improved mass-productivity and reliability and satisfying the temperature cycle test.

By the way, the packaging rank of the circuit board having the four-layered structure was measured and the circuit board was subjected to the temperature cycle test (−65° C. to 150° C.). The packaging rank of the subject circuit board defined by JEDEC was "Level 3" while that of the conventional circuit board was "Level 5". The number of cycles endured by the subject circuit board was 500 while that of the conventional circuit board was less than 100.

The floating conductive layer 14 includes a top floating conductive layer 20 and a bottom floating conductive layer 21 formed on each of the surfaces of the base member 12. The surface of the floating conductive layer 14 is chemically treated (surface-roughing) for elevating the bonding between the floating conductive layer 14 and resin or solder resist.

The top floating conductive layer 20 and the bottom floating conductive layer 21 are disposed between the base member 12 and a dielectric layer 15 such that the floating conductive layers 20, 21 fill space regions extending, with a specific interval, in directions perpendicular to the thicknesses of the top interconnect layer 17 and the bottom interconnect layer 18, respectively. Accordingly, the floating conductive layers 20, 21 do not exert an inverse effect such as short-circuit to the top interconnect layer 17 and the bottom interconnect layer 18, and cover almost all the surfaces of the base member 12. The top floating conductive layer 20 and the top interconnect layer 17 are disposed parallel to each other on the single plane, and the bottom floating conductive layer 21 and the bottom interconnect layer 18 are disposed parallel to each other on the single plane.

The dielectric layer 15 includes a top dielectric layer 15a (for example, solder resist) and a bottom dielectric layer 15b (for example, solder mask), which, respectively, cover the top interconnect layer 17 and the top floating conductive layer 20, and the bottom interconnect layer 18 and the bottom floating conductive layer 21, other than the exposed portions.

An openings 22 for wire bonding pad is formed on the top dielectric layer 15a, and a resist mask 23 is formed on the periphery of the opening 22 in an upward projecting fashion.

The material used for die-mounting includes an Ag-paste-based material and a tape-shaped material. When the Ag-paste-based material is used, the resist mask 23 is applied twice for increasing the thickness, or the distance between the bonding pad (exposed portion of the top interconnect layer 17) and the die is sufficiently increased for preventing the short-circuit due to the exudation of the Ag-paste-based material.

An openings 24 for land bonding is formed on the bottom dielectric layer 15b.

In the circuit board 11 thus fabricated, the ingress of the moisture into the rear (bottom) surface of the top dielectric surface 15a and into the rear (top) surface of the bottom dielectric surface 15b can be prevented. Further, the materials having coefficients of thermal expansion different from each other can be used as those of the top interconnect layer 17 and bottom interconnect layer 18. Accordingly, the selection of the specific material is unnecessary different from the conventional circuit board fabrication.

In the first embodiment, the thickness of the entire circuit board can be reduced because the increase of the thickness of the interconnect layer is unnecessary for preventing the generation of the cracks in the circuit board.

Figure 6:
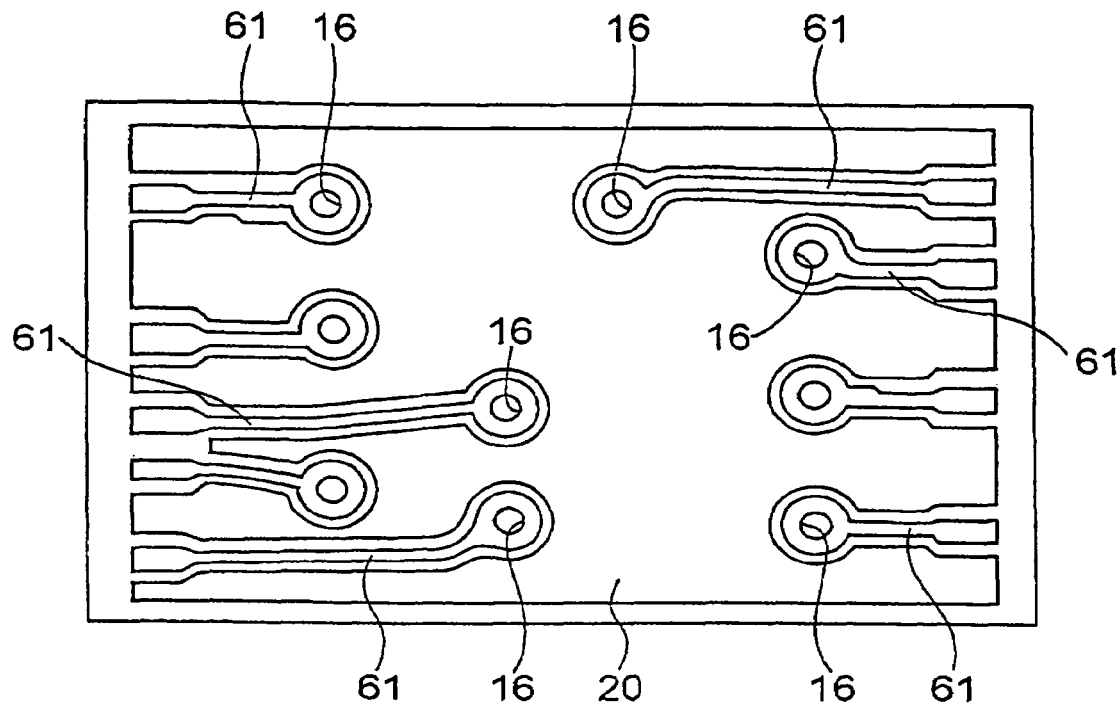
FIG. 6 is a top plan view showing a circuit board in accordance with a second embodiment after an interconnect layer and a floating conductive layer are formed.

Although the interconnect pattern having the lager width is used in the top interconnect layer 17 in the first embodiment, the pattern width is not restricted thereto. As shown in FIG. 6 illustrating a circuit board of a second embodiment, a top interconnect layer 61 can be formed by using an interconnect pattern having an ordinary width having no inverse effect on the high speed operation when the circuit board is used in a high speed semiconductor integrated circuit having no or little margin to operation speed.

Figure 7:
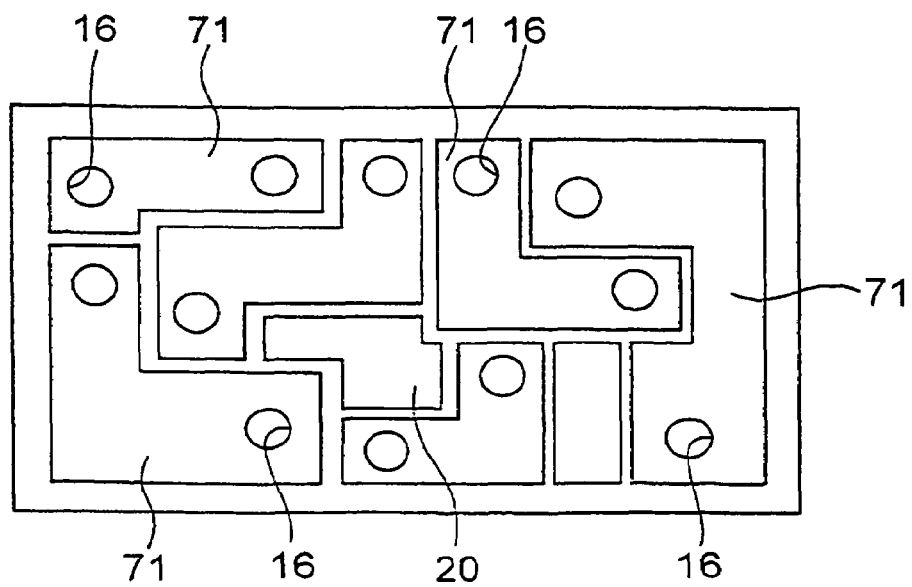
FIG. 7 is a top plan view showing a circuit board in accordance with a third embodiment after an interconnect layer and a floating conductive layer are formed.

The number of the interconnect layers, the planer shape and the layout of the circuit board are not restricted to the first and second embodiments. As shown in FIG. 7 illustrating a circuit board of a third embodiment, a top interconnect layer 71 having a shape with right angles may be used.

Figure 8:
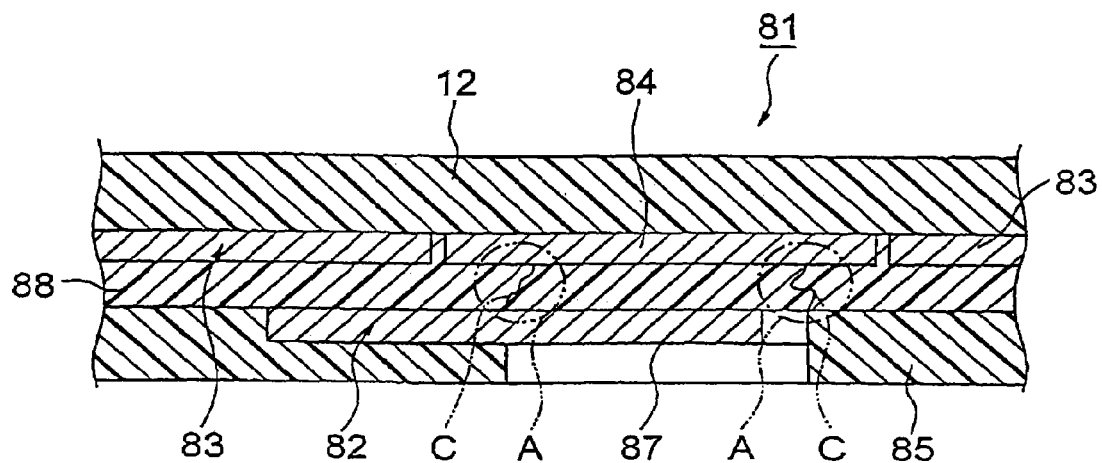
FIG. 8 is a vertical sectional view showing a circuit board in accordance with a fourth embodiment.

As shown FIG. 8 illustrating a circuit board of a fourth embodiment, the circuit board 81 has a triple layered interconnect structure, that is, includes a top interconnect layer (not shown) on the top surface of the base member 12 having the same configuration as that of the first embodiment, and a first bottom interconnect layer 82 and a second bottom interconnect layer 83 on the bottom surface of the base member 12. The circuit board 81 further includes a floating conductive layer 84, a first dielectric layer 85 and a second dielectric layer 86.

Part of the first bottom interconnect layer 82 is externally exposed for forming a land section 87.

The second bottom interconnect layer 83 is disposed overlying the first bottom interconnect layer 82 and the first dielectric layer 85 and sandwiching the second dielectric layer 86, or disposed between the base member 12 and the second dielectric layer 86.

The floating conductive layer 84 and the first bottom interconnect layer 82 are disposed such that, if the floating conductive layer 84 does not exist, a portion (indicated by a chain line "A") in which a crack "C" is likely generated is sandwiched thereby and the floating conductive layer 84 fills the space region near the second bottom interconnect layer 83. The floating conductive layer 84 and the second bottom interconnect layer 83 are disposed on the single plane. The first bottom interconnect layer 82 and the first dielectric layer 85 are disposed on the single plane.

The first dielectric layer 85 partially covers the first bottom interconnect layer 82 and sandwiches, with the floating conductive layer 84 and the second bottom interconnect layer 83, the second dielectric layer 86.

In the circuit board thus configured, almost all the surfaces of the base member 12 are covered with the second bottom interconnect layer 83 and the floating conductive layer 84. Accordingly, the selection of the specific material is unnecessary similarly to the first embodiment.

In the present embodiment, the generation of the crack "C" in the second dielectric layer 86 between the base member 12 and the first dielectric layer 85 is suppressed by the presence of the floating conductive layer 84, or the floating conductive layer 84 acts as a crack stopper for the second dielectric layer 86. Accordingly, the thickness of the entire circuit board can be reduced similarly to the first embodiment.

Figure 9:
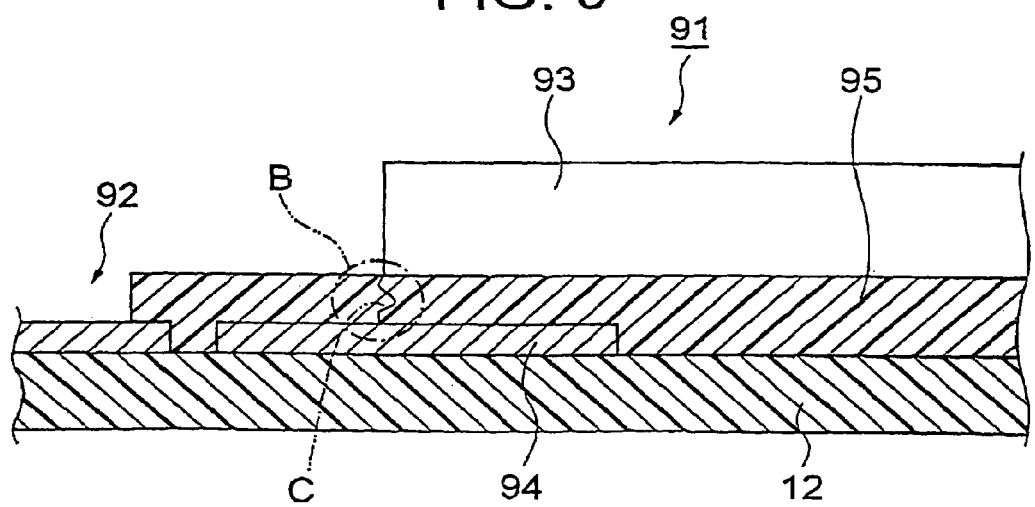
FIG. 9 is a vertical sectional view showing a circuit board in accordance with a fifth embodiment.

As shown FIG. 9 illustrating a circuit board of a fifth embodiment, the circuit board 91 has a double layered interconnect structure, that is, includes an interconnect layer 92 and a die 93, and further includes a floating conductive layer 94 and a dielectric layer 95 overlying the base member 12 having the same configuration as that of the first embodiment.

The interconnect layer 92 is layered on the base member 12 and part of the interconnect layer 92 is externally exposed.

The die 93 overlies the base member 12 and sandwiches, with the base member 12, the interconnect layer 92, the floating conductive layer 94 and the dielectric layer 95.

The floating conductive layer 94 fills the space region near the interconnect layer 92 and is disposed such that, if the floating conductive layer 94 does not exist, a portion (indicated by a chain line "B") in which a crack "C" is likely generated is supported thereby. The floating conductive layer 94 and the interconnect layer 92 are disposed on the single plane.

The dielectric layer 95 covers part of the interconnect layer 92 and the whole floating conductive layer 94 between the base member 12 and the die 93.

In the circuit board thus configured, almost all the surfaces of the base member 12 are covered with the interconnect layer 92 and the floating conductive layer 94. Accordingly, the selection of the specific material is unnecessary similarly to the first embodiment.

In the present embodiment, the generation of the crack "C" in the dielectric layer 95 between the base member 12 and the die 93 is suppressed by the presence of the floating conductive layer 94. Accordingly, the thickness of the entire circuit board can be reduced similarly to the first embodiment.

Since the above embodiments are described only for examples, the present invention is not limited to the above embodiments and various modifications or alterations can be easily made therefrom by those skilled in the art without departing from the scope of the present invention.

What is claimed is:

1. A circuit board comprising:
   a base member,
   a first interconnect layer formed on a part of the base member,
   an electrically-floating conductive layer formed on a substantially remaining part of the base member and having an edge adjacent to an edge of the first interconnect layer,
   a dielectric layer covering a part of the first interconnect layer and an entire surface of the electrically-floating conductive layer and filling a gap between the edge of the first interconnect layer and the edge of the electrically-floating conductive layer,
   a second interconnect layer formed on the dielectric layer,
   a bottom interconnect layer arranged on an opposite side of the base member and including a land, and
   a further electrically-floating conductive layer arranged on the opposite side of the base member and having an edge adjacent to an edge of the bottom interconnect layer,
   wherein a combined volume of the bottom interconnect layer and the further electrically-floating conductive layer is substantially equal to a combined volume of the first interconnect layer and the electrically-floating conductive layer.

2. The circuit board as defined in claim 1, wherein the first interconnect layer includes patterns having a larger width than the electrically-floating conductive layer.

3. The circuit board as defined in claim 1, wherein the electrically-floating conductive layer is chemically treated to improve a bond between the electrically-floating conductive layer and the dielectric layer.

4. The circuit board as defined in claim 1, wherein the land is soldered to a system circuit board and is connected to via holes.

5. The circuit board as defined in claim 1, wherein the dielectric layer further covers the bottom interconnect layer and the further electrically-floating conductive layer and fills a further gap between an edge of the bottom interconnect layer and an edge of the further electrically-floating conductive layer.

6. The circuit board as defined in claim 5, wherein the dielectric layer covering the first interconnect layer and the electrically-floating conductive layer includes a solder resist.

7. The circuit board as defined in claim 5, wherein the dielectric layer covering the bottom interconnect layer and the further electrically-floating conductive layer includes a solder mask.

8. The circuit board as defined claim 1, wherein a crack in the dielectric layer between the base member and a die is suppressed by the presence of the electrically-floating conductive layer.

9. The circuit board as defined in claim 1, wherein the electrically-floating conductive layer acts as a crack stopper for the dielectric layer.

* * * * *